United States Patent [19]

Hieda et al.

[11] Patent Number: 5,119,155
[45] Date of Patent: Jun. 2, 1992

[54] SEMICONDUCTOR MEMORY DEVICE WITH DIELECTRIC ISOLATION

[75] Inventors: Katsuhiko Hieda, Yokohama; Tohru Ozaki, Tokyo, both of Japan

[73] Assignee: Kabushiki Kaisha Toshiba, Kawasaki, Japan

[21] Appl. No.: 619,616

[22] Filed: Nov. 29, 1990

[30] Foreign Application Priority Data

Nov. 29, 1989 [JP] Japan .................................. 1-309697

[51] Int. Cl.⁵ ...................... H01L 29/68; H01L 29/06; H01L 27/12; H01L 27/01
[52] U.S. Cl. ..................................... 357/23.6; 357/55; 357/49; 357/23.7
[58] Field of Search ............................... 357/23.6, 23.7

[56] References Cited

U.S. PATENT DOCUMENTS 4,791,610 12/1988 Takemae ........................ 357/23.6 G
5,021,842 6/1991 Koyanagi ............................ 357/23.6

FOREIGN PATENT DOCUMENTS 207055 9/1986 Japan .................................. 357/23.6

Primary Examiner—Rolf Hille
Assistant Examiner—Robert P. Limanek
Attorney, Agent, or Firm—Finnegan, Henderson, Farabow, Garrett & Dunner

[57] ABSTRACT

In a semiconductor memory device, a trench is formed in a surface of a memory cell forming region of the substrate. The overall surface of the memory cell forming region, inclusive of the inner wall of the trench, is covered with an insulator film. A capacitor is formed on the inner surface of the trench through the insulator film. A MOSFET is formed in a semiconductor layer formed on a surface of a flat portion of the substrate. One of the source and drain regions of the MOSFET reaches the periphery of the trench so as to be connected to a storage node electrode of the capacitor.

5 Claims, 11 Drawing Sheets

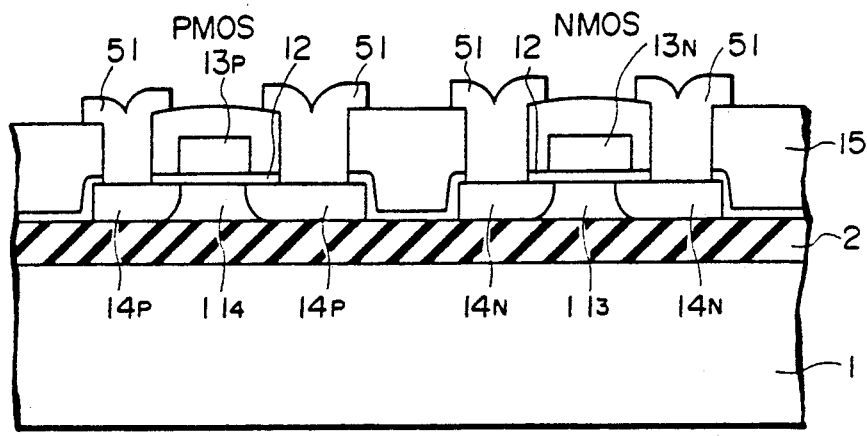
FIG. 12
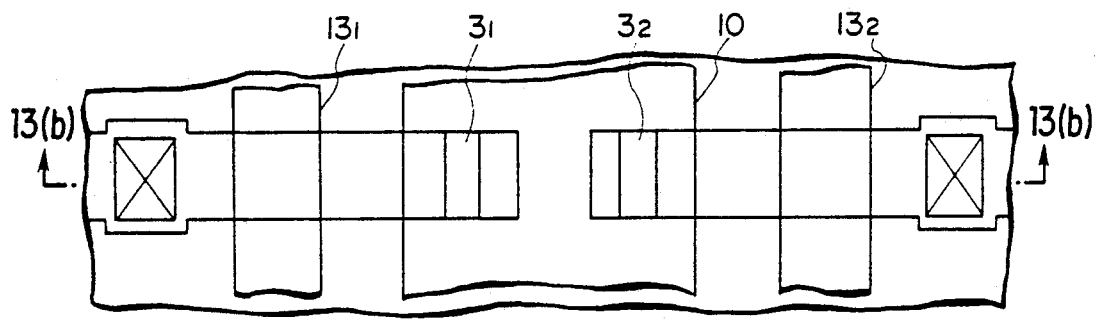
FIG. 13(a) *(PRIOR ART)*
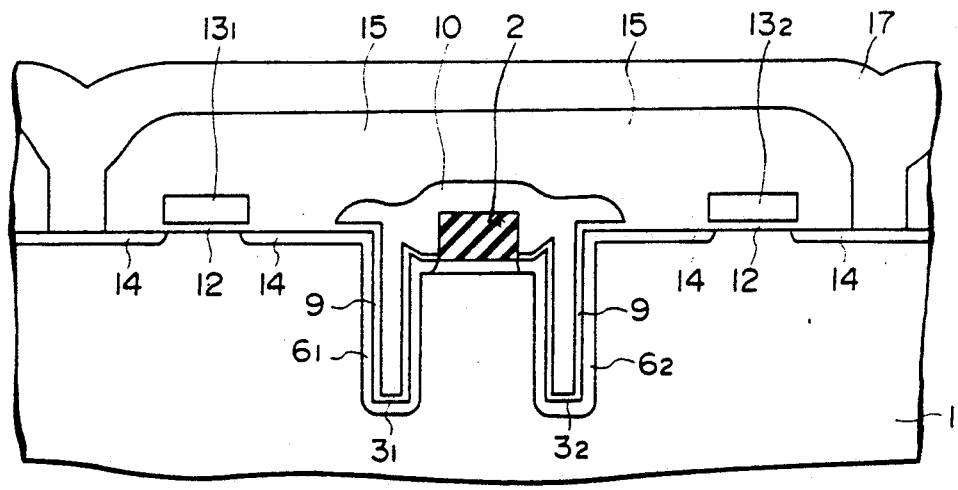
FIG. 13(b) *(PRIOR ART)*

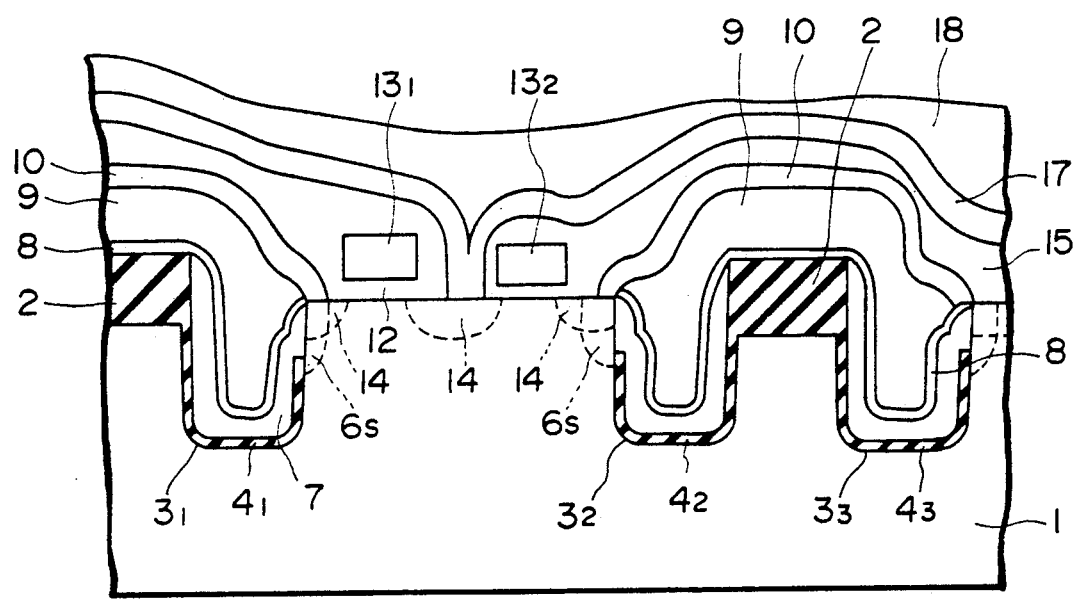
FIG.14 *(PRIOR ART)*

SEMICONDUCTOR MEMORY DEVICE WITH DIELECTRIC ISOLATION

FIELD OF THE INVENTION

The present invention relates to a semiconductor memory device and a method of manufacturing same and more particularly to a dynamic RAM (DRAM) of a trench type capacitor structure and a method of manufacturing same.

BACKGROUND ART

Recently, semiconductor memory devices increase steadily both in their integration degree and capacity. Research has been conducted for miniaturization of memory cells in a MOS dynamic RAM (DRAM) comprising a single MOSFET and a single MOS capacitor.

Due to the miniaturization of the memory cells, however, the area of the capacitor for storing information (electric charges) is reduced. As a result, soft errors such as misreading of the contents of the memory device or breakage of the contents of the memory device by α-rays have become problems to be solved.

Various methods have been proposed to increase integration degree and capacity while preventing the soft errors. In the methods, efforts have been made to substantially increase the capacity of the capacitor and hence stored electric charge without increasing the area occupied by the capacitor.

One proposal is a DRAM having the following trench type capacitor structure.

A plan view and a cross-sectional view of such DRAM is shown in FIGS. 13(a) and 13(b). in which the DRAM comprises trenches 3 ($3_1$, $3_2$, ...) formed in a surface of a p-type silicon substrate 1 and n-type layers 6 ($6_1$, $6_2$, ...) formed on the inner walls of the trenches 3, capacitor insulator films 9 and plate electrodes 10 embedded in this order on the surfaces of the n-type layers to form capacitors. With this structure, the area (capacity) of the capacitor is increased without increasing the size of the capacitor.

Each MOSFET comprises source and drain regions 14 of an n-type layer and a gate electrode 13 ($13_1$, $13_2$, ...), a gate insulator film 12 being formed between the source and drain regions 14 and the gate electrode 13, and formed within an element region defined by a yield oxide film 2 which is formed on the surface of the silicon substrate 1. Each MOS capacitor comprises an n-type layer 6 disposed on the inner wall of an adjacent trench 3 and connected to the n-type layer source or drain region 14 ($14_1$, $14_2$, ...), a capacitor insulator film 9 formed on the surface of the n-type layer 6 and a plate electrode 10 embedded in the trench 3.

In this structure, the inner wall of the trench 3 is used to form the MOS capacitor. Therefore, the capacity of the capacitor is increased several times as large as that of a planar structure. Thus, this structure prevents a decrease in the electric charges stored in the memory cell even if the area occupied by the memory cell is reduced. Accordingly, this structure provides a small-sized DRAM having a large capacity of memory.

With the above-described structure, however, as the distance between the trenches $3_1$ and $3_2$ of adjacent memory cells is reduced, stored electric charges (information) are likely to be lost by punch-through which causes an error in the stored data.

This error occurs in a situation where information charges are stored in the n-type layer $6_1$ of one trench $3_1$ and no information charges are stored in the n-type layer $6_2$ of the other trench $3_2$. In such situation, the information charges stored in the n-type layer $6_1$ move to the other n-type layer $6_2$. As the depth of the trench increases, an error is more likely to occur. This is because, the length for the horizontal diffusion in the n-type layer 6 increases as the trench becomes deeper, so that the distance between adjacent n-type layers becomes relatively reduced.

Therefore, if a trench is, for example, 5 um deep, it is very difficult to reduce the distance between the adjacent trenches to 1.5 μm or less.

This has become a big problem which prevents a further increase in the integration degree of DRAMs.

Referring to FIG. 14, a structure is proposed in order to solve the above problem in the structure, a capacitor is formed by sequentially forming a storage node electrode 7, a capacitor insulator film 9 and a plate electrode 10 through an insulator film 4 ($4_1$, $4_2$, $4_3$) on the inner wall of a trench 3 ($3_1$, $3_2$, $3_3$)(Refer to Unexamined Japanese Patent Publication Sho 61-67954). The numeral 6s denotes an n-type layer which connects the storage node electrode 7 to an n-type layer 14 which constitutes the source and drain regions, and 17 and 18 denote a bit line and a protective film, respectively.

Since the trench inside wall is covered with the insulator film 4 in this structure, there is no danger of leakage due to punch-through which would otherwise occur between the n-type layers $6_1$ and $6_2$ in the structure of FIG. 13 even if the distance between the adjacent trenches is reduced.

However, there is a problem of reduction in the S/N ratio due to many depletion layers present in the interface between the substrate 1 and insulator film 4. These depletion layers are a depletion layer extending from the n-type layer 14 constituting the source and drain regions, and a depletion layer formed on a part of the trench inner wall and extending from the n-type layer 6s to connect the storage electrode 7 and the n-type layer 14.

Further, in forming very small hole-shaped storage node contacts the patterning in a part of the insulator film 4 in the trench inner wall to connect the n-type layer 6s and storage node electrode 7, misalignment of masks in the patterning causes leakage problems.

As described above, in the conventional trench capacitor structures, a reduction in the S/N ratio due to the depletion layers present in the interface between the substrate and the insulator film on the trench inner wall is a problem, and it is required very strict resolution and alignment in patterning the storage node contact.

SUMMARY OF THE INVENTION

The present invention is made in view of the above situation. It is an object of the present invention to provide a semiconductor memory device having trench type capacitor structure which provides a high S/N ratio and produces no leakage even if the areas of its elements are reduced.

A semiconductor memory device according to the present invention comprises a semiconductor substrate formed with a trench in a surface thereof, the surface of the substrate and an inner wall of the trench being covered with an insulator film, a capacitor including a storage node electrode of a first semiconductor layer having low resistance, a capacitor insulator film and a plate electrode, the storage node electrode, the capacitor insulator film and the plate electrode being sequentially laminated on the inner wall of the trench via the insulator film, and a MOSFET including a gate electrode formed on a surface of a second semiconductor layer and source and drain regions formed in the second semiconductor layer, the second semiconductor layer being formed on a surface of the substrate with a channel region between the source and drain regions one of the source and drain regions extending to a periphery of the trench so as to be connected to the storage node electrode.

A method of manufacturing the semiconductor memory device according to the present invention comprises the steps of forming an insulator film on a surface of a semi-conductor substrate, forming a trench at a predetermined position in the semiconductor substrate, and covering an inner wall of the trench with an insulator film, forming a first semiconductor layer on a surface of the substrate and on the inner wall of the trench, and patterning the first semiconductor layer in a desired shape, injecting impurities into the first semiconductor layer on the inner wall of the trench to reduce the resistance of the first semiconductor layer so as to form a storage node electrode, and sequentially forming a capacitor insulator film and a plate electrode on the storage node electrode so as to form a capacitor, and forming a gate insulator film and a gate electrode on the surface of the first semiconductor layer on the substrate, injecting impurities having a desired density into the first semiconductor layer on the substrate to form source and drain regions connected to the first semiconductor layer on the inner wall of the trench and a channel region between the source and drain regions.

With the structure of the memory device, the substrate, the MOSFET and the capacitor are completely insulated from each other so that they are not influenced by electrons generated in the substrate by α-rays, etc. Therefore, the memory device according to the present invention provides a structure which is highly resistant to socalled soft errors.

Further, since the memory device has a SOI (Silicon on Insulator) structure, it completely suppresses punchthrough occurring through the substrate. Therefore, high degree of integration can be attained relatively easily.

Since punch-through is not likely to occur between the trenches constituting the capacitors the distance between the trenches can be reduced. Therefore, it becomes possible to increase the area occupied by the trench, so that the depth of the trench can be reduced, which makes it easy to form the trench.

Furthermore, the memory device according to the present invention does not require any contacts for connecting the MOSFET to the capacitor, so that high degree of integration is achieved.

BRIEF DESCRIPTION OF THE DRAWINGS

FIGS. 2(a), 2(b)-6(a), 6(b) illustrate the steps of manufacturing the DRAM of FIG. 1;

FIG. 12 shows another example of the peripheral circuit; and

FIGS. 13(a)-13(b) and 14 show conventional DRAMs.

DETAILED DESCRIPTION OF THE INVENTION

Embodiments of the present invention will be described in detail with reference to the drawings.

EMBODIMENT 1

Figure 1A:
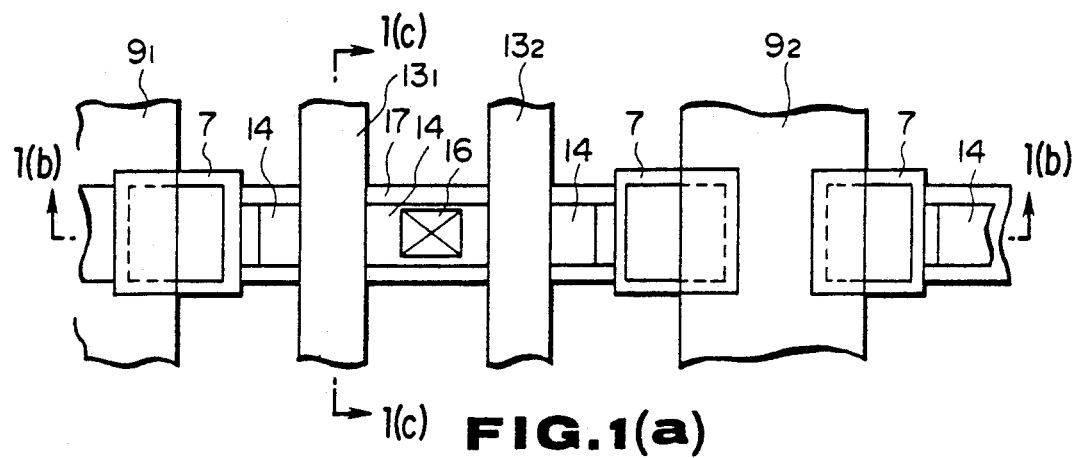
FIGS. 1(a)-1(c) illustrate a DRAM of a first embodiment of the present invention.
Figure 1B:
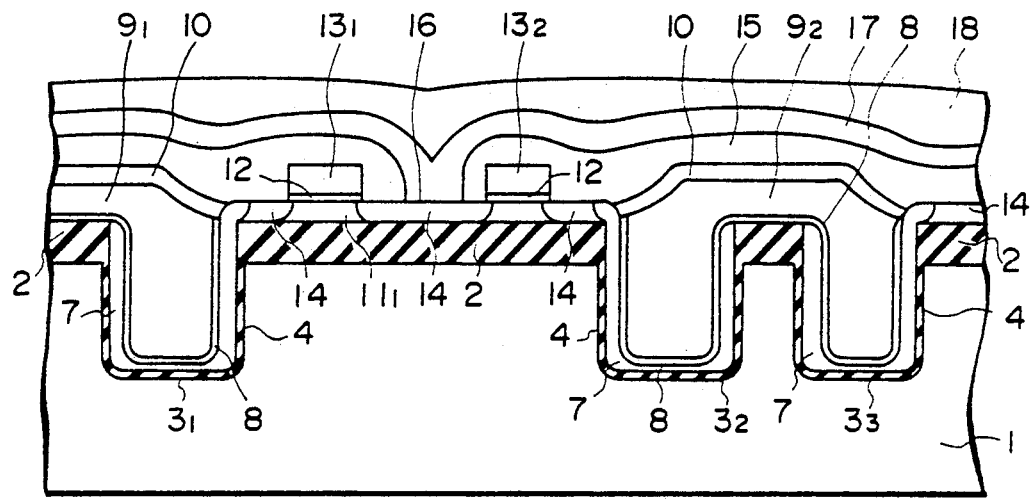
Figure 1C:
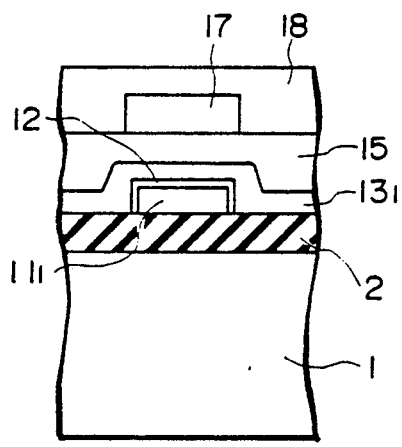

FIGS. 1(a), 1(b) and 1(c) are a plan view of a first embodiment of a semiconductor memory device according to the present invention, and a cross-sectional view taken along the line 1(b)—1(b) of FIG. 1(a) and a cross-sectional view taken along the line 1(c)—1(c) of FIG. 1(a).

The DRAM is characterized in that: the surface of a flat portion of a memory cell region in a p-type silicon substrate 1 is covered with an insulator film 2. The inner wall of a trench 3 is also completely covered with an insulator film 4. A MOSFET is constituted by forming a gate electrode 13 ($13_1$, $13_2$, ...) of a third polycrystalline silicon layer through a gate insulator film 12 and a source or drain region 14 of an n-type layer so as to self adjusted to the corresponding gate electrode in a channel region 11 made of a first polycrystalline silicon layer formed through an insulator film on the flat surface of the substrate. A capacitor is constituted by embedding sequentially a storage node electrode 7 ($7_1$, $7_2$ ...) of a first polycrystalline silicon film, a capacitor insulator film 8 of a double layer including a silicon oxide film and a silicon nitride film, and a plate electrode 9 ($9_1$, $9_2$ ...) of a second polycrystalline silicon layer through an insulator 4 in the corresponding trench 3 ($3_1$, $3_2$ ...). One of the n-type layers constituting the source and drain regions 14 is formed so as to overlap with the storage node electrode 7. The storage node 5 constitutes a part of the source and drain.

The gate electrodes 13 are disposed in rows on one side of a memory cell matrix to constitute the corresponding word lines.

Figure 2A:
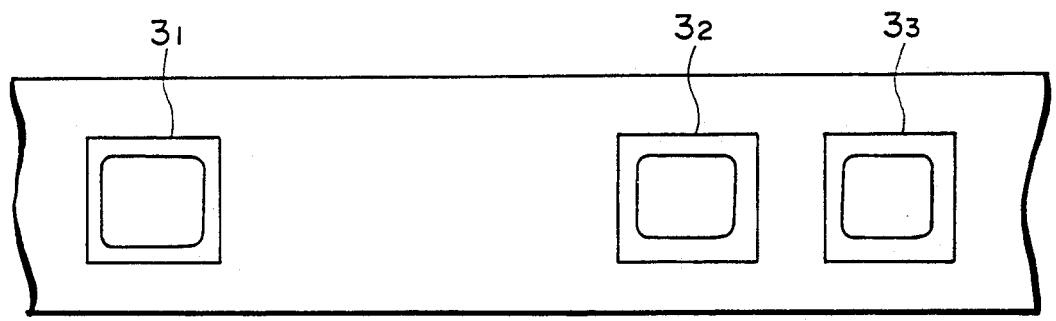
Figure 2B:
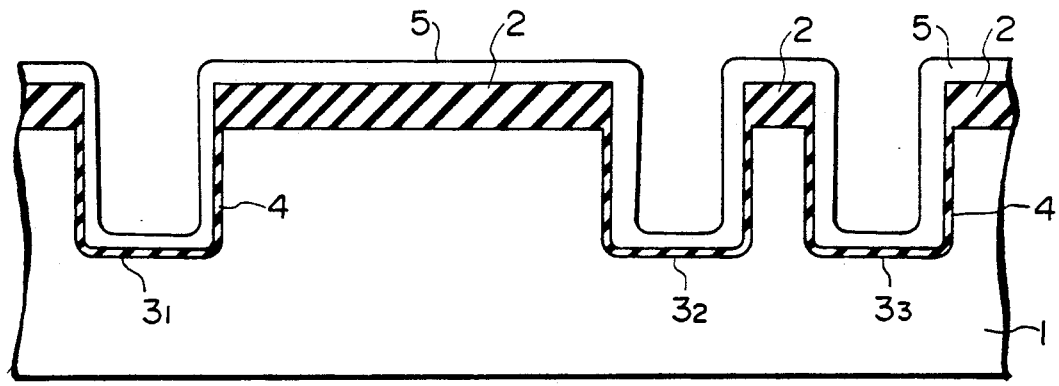

The substrate surface on which the MOSFET and capacitor are formed is covered with an inter-layer insulator film 15. Bit lines 17 are disposed perpendicular to the corresponding word lines so as to connect through bit line contacts 16 to the other of the n-type layers constituting the source and drain regions 14. The numeral 18 denotes a protective film The steps of manufacturing the DRAM will now be described. First, an insulator film 2 of a silicon oxide film 700 nm thick is formed by thermal oxidation on a p-type silicon substrate 1 having a resistivity of about 5 cm. A resist pattern is formed on the insulator film 2 and the insulator film 2 in the trench forming region is etched away by anisotropic etching. The substrate surface is etched using the remaining insulator film 2, as the mask to form the trench 3. The resulting product surface is then subjected to wet processing with an alkali solution to etch the substrate by about 20 nm to thereby etch away etching damages incurred when the trench is formed. The exposed inner wall of the trench 3 is oxidized at 900° C. in a steam atmosphere to form a silicon oxide film 4 having a thickness of 800 Å. A first polycrystalline silicon film 5 having a thickness of about 100 nm is deposited on the overall resulting substrate surface by CVD (FIGS. 2(a) and 2(b)).

Figure 3A:
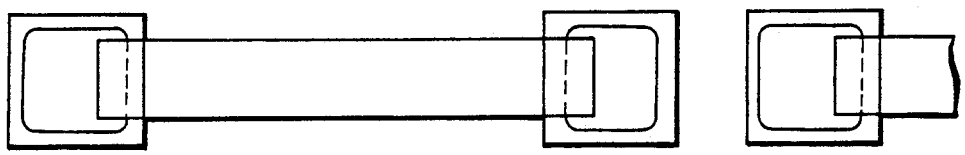
Figure 3B:
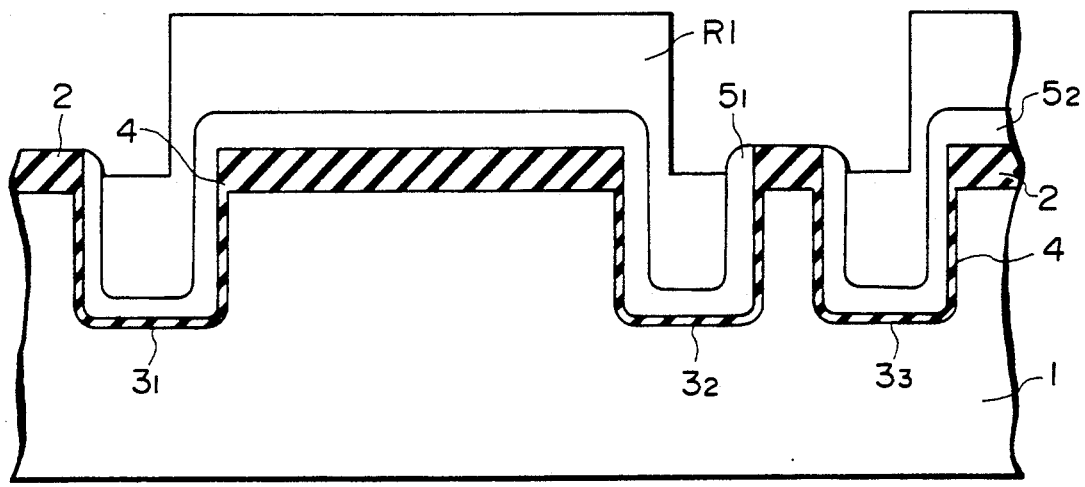

Thereafter, as shown in FIGS. 3(a) and 3(b), the first polycrystalline silicon layer 5 is patterned using a resist pattern R1 as the mask. At this time, conditions are set such that when the resist is exposed to light and developed, the resist R1 will remain in the trench bottoms also after development. In this way, the first polycrystalline silicon layer 5 is left only in the MOSFET and bit line contact forming region (flat portion) and in the region except for the trench inner walls.

Figure 4A:
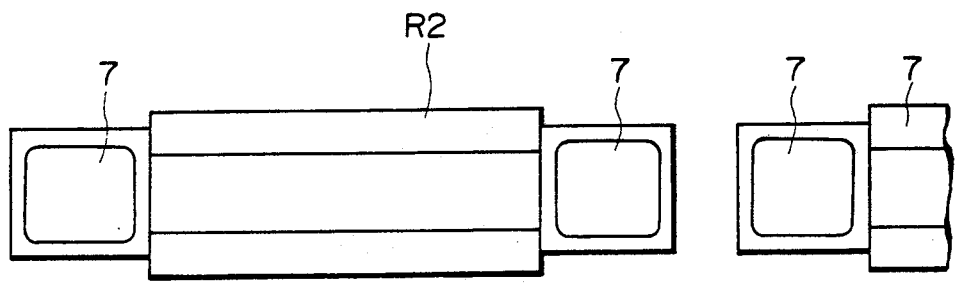
Figure 4B:
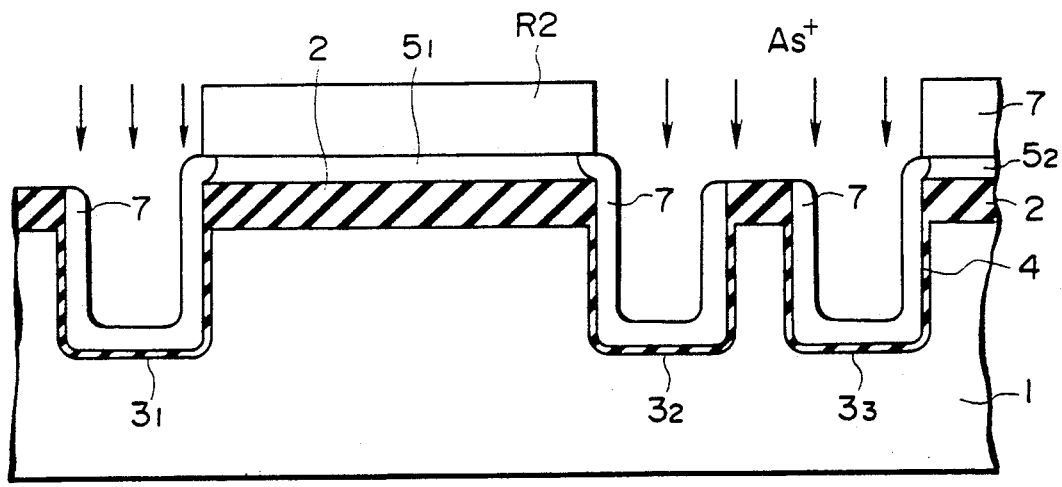

Subsequently, as shown in FIGS. 4(a) and 4(b), the flat portion which includes the MOSFET and bit line contact forming region is covered with resist R2 and the trenches are implanted with arsenic ions (As+) at an angle of 15 degrees to the flat portion to thereby reduce the resistance of the first polycrystalline silicon layer 5 on the trench inner wall to thereby form a storage node electrode 7.

Alternatively, doping the first polycrystalline silicon layer constituting the storage node electrode may be performed by depositing an AsSG film by CVD on the overall resulting surface, etching back the AsSG film by reactive ion etching, leaving the AsSG film only in the trench inner wall, heating the product, for example at 900° C. for about 30 minutes to thereby perform a solid phase diffusion from the AsSG film. In this case, the AsSG film after doping is etched away with NH4F or the like.

Figure 5A:
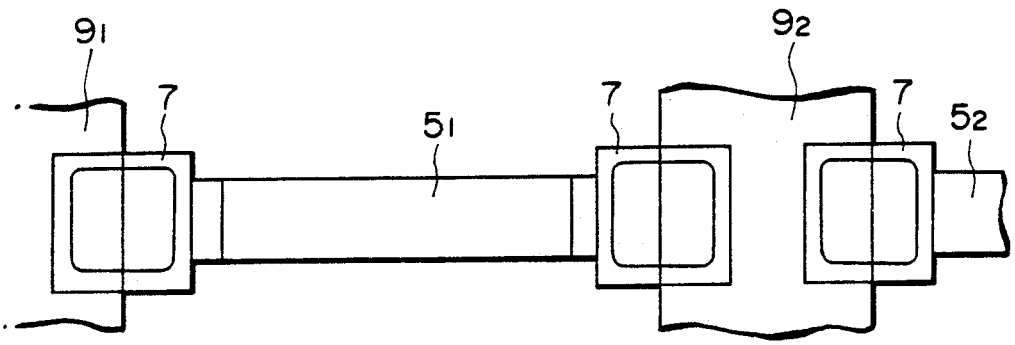
Figure 5B:
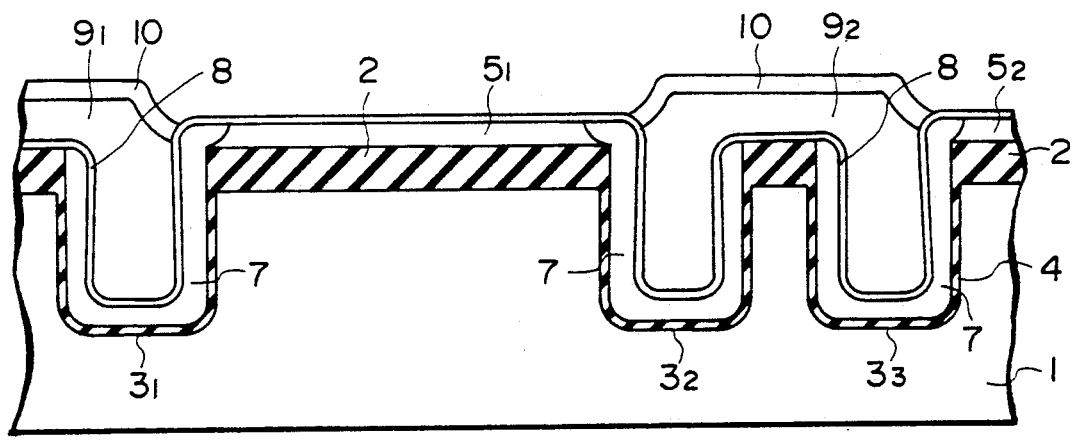

Thereafter, as shown in FIGS. 5(a) and 5(b), the resist pattern R2 is eliminated, the surface of the storage node electrode 7 is cleaned, a capacitor insulator film 8 made of a double film which includes a silicon nitride film having a thickness of about 5 nm and a silicon oxide film having a thickness of about 3 nm is formed, a second n-type doped polycrystalline silicon film is formed, and same is then patterned to form a plate electrode 9. At this time, it is important to form the plate electrode 9 such that it does not overlap the flat portion which is the MOSFET forming region rather than the trench. By doing so, it is unnecessary to take an aligning margin of the gate electrode for the plate electrode, so that the memory cells are further miniaturized.

Thereafter, the appropriate surface of the resulting product is oxidized in a steam atmosphere at 850 ° C. to form a silicon oxide film 10 having a thickness of 100 nm on the surface of the plate electrode 9. It is to be noted at this time that the capacitor insulator film 8 should remain on the first polycrystalline silicon film in the MOSFET forming region for preventing oxidization. If the capacitor insulator film has already been patterned using the plate electrode as the mask, a silicon oxide film may be deposited by CVD, patterned so as to cover the plate electrode 9 and used in place of the silicon oxide film 10. By doing so, the oxidization of the first polycrystalline silicon film surface in the MOSFET forming region is completely prevented.

Figure 6A:
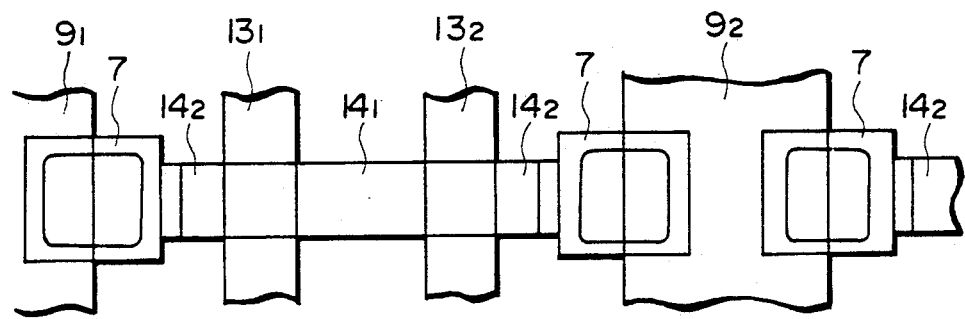
Figure 6B:
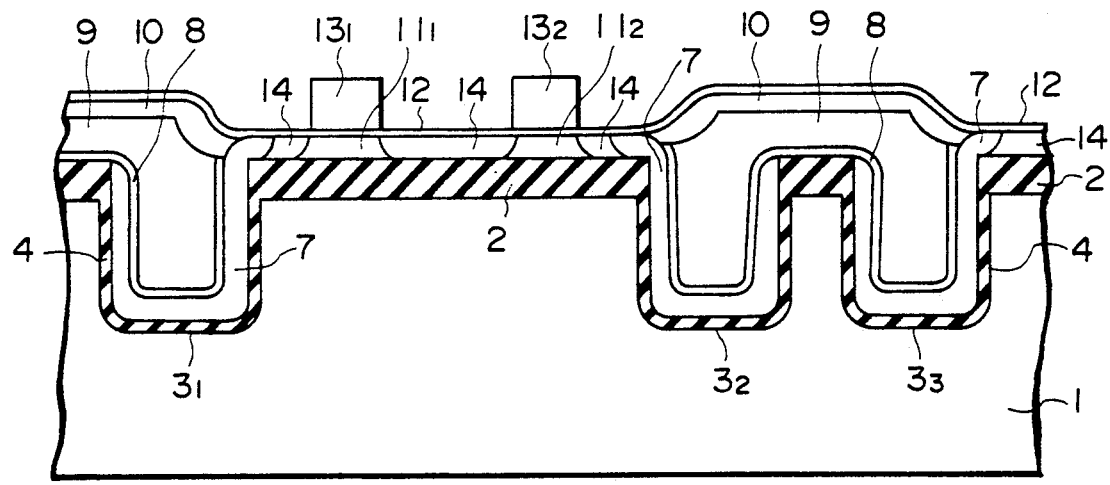

Subsequently, as shown in FIGS. 6(a) and 6(b), impurities having a density equal to a desired threshold value are injected into the first polycrystalline silicon of the MOSFET forming region to form a channel region 11. Thereafter, the insulator film 8 covering the surface is removed to temporarily expose the surface of the channel region 11 temporarily. Thereafter, a gate insulator film 12 having a thickness of about 10 nm and made, for example, of a silicon nitride film and its oxide film is formed. At this time, it may be arranged such that the gate insulator film is formed and that impurities are then injected for forming the channel region. In addition, a polycrystalline silicon layer to which n-type impurities are added is deposited and patterned to form a gate electrode 13 which will be a word line.

Thereafter, for example, arsenic ions are implanted using the gate electrode 13 as the mask to form an n-type layer 14 as the source and drain regions. The n-type layer 14 has a part which overlaps with the polycrystalline silicon layer which constitutes the storage node electrode 7 already formed in the trench to achieve electrical connection.

Thereafter, a silicon oxide film 15 is deposited by CVD on the overall surface of the substrate, a contact hole 16 is formed in the silicon oxide film 15, a bit line 17 of so-called polycide is formed which includes a polycrystalline silicon layer and a molybdenum silicide, a passivation film such as a CVD insulator film or BPSG film is deposited on the overall appropriate surface of the resulting product to complete the DRAM shown in FIG. 1.

As shown according to the DRAM of the first embodiment of the invention, the MOSFET and capacitor are completely insulated from the silicon substrate 1, so that they are never influenced by electrons produced in the substrate by α-rays and hence the DRAM has a structure which exhibits high resistance to so-called soft errors.

The source and drain of the MOSFET and the storage node electrode of the capacitor are formed in the same polycrystalline silicon layer, and no special region for forming a contact to connect those elements is required, so that a very high degree of integration is achieved.

Punch-through through the substrate is completely suppresses to thereby easily achieve a high degree of integration.

No punch-through occurs between adjacent trenches which constitute a part of the capacitor, so that the distance between the trenches is reduced to a minimum value determined by the limitations of lithography.

EMBODIMENT 2

A second embodiment of the present invention will now be described.

This embodiment is a modification of the first embodiment directed to the channel separation of the MOSFET. Only a cross-sectional view corresponding to that in FIG. 1(c) is shown here. The remaining structure of the second embodiment is similar to that of the first embodiment.

Figure 7:
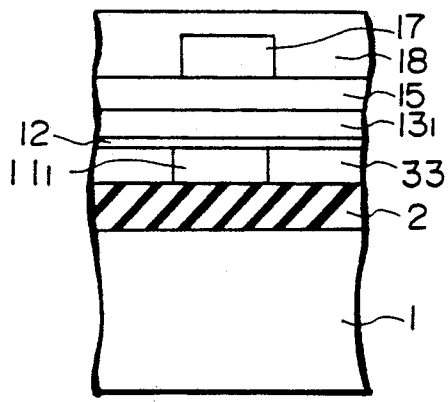
FIG. 7 illustrates a DRAM of a second embodiment of the present invention.
Figure 9:
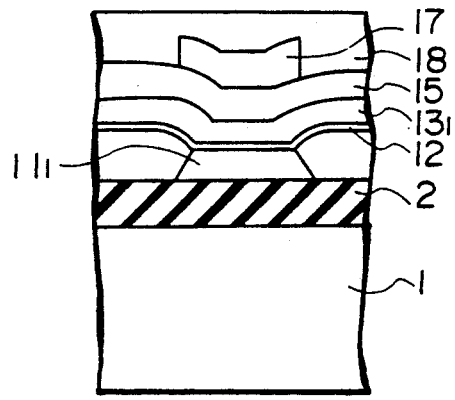
FIG. 9 illustrates a DRAM of a third embodiment of the present invention.
Figure 8A:
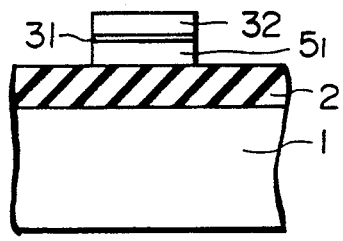
FIGS. 8(a)-8(d) illustrate the steps of manufacturing the DRAM in the embodiment of FIG. 7.

In the second embodiment, as shown in FIG. 7, the channel region 11 (11₁) is embedded in a silicon oxide film 33 formed by CVD, so that the sidewall of the channel region 11 is surrounded by the silicon oxide film 33 to thereby prevent the formation of a parasitic channel in the sidewall and to form an element region of high flatness.

The process for manufacturing the DRAM will be described next.

FIGS. 8(a)-8(d) are cross-sectional views of the DRAM, showing the corresponding process steps.

First, similar to the first embodiment, a silicon oxide film 2 having a thickness of about 700 nm is formed on a surface of a silicon substrate 1, a trench 3 is formed, a first polycrystalline silicon film 5 is deposited by CVD so as to be about 100 nm thick on the overall surface of the substrate. Deposited sequentially by CVD on the film 5 are a silicon oxide film 31 having a thickness of about 40 nm and a silicon nitride film 32 having a thickness of about 150 nm. The films 31 and 32 are processed using a resist pattern, the first polycrystalline silicon film 5 is patterned using the films 31 and 32 as the mask by reactive ion etching (FIG. 8(a)).

Figure 8B:
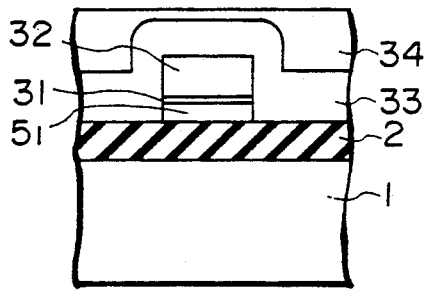

As shown in FIG. 8(b), a silicon oxide film 33 is by CVD deposited 400 nm thick on the overall surface of the resulting product and then a resist 34 is coated on the silicon film 33.

Figure 8C:
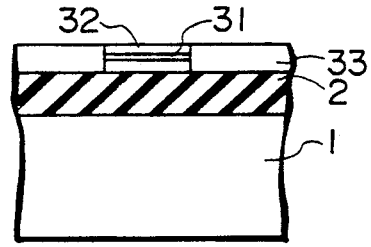

Thereafter, as shown in FIG. 8(c) the surface of the resist 34 is flattened out by etch-back to thereby expose the silicon oxide film 32 in the MOSFET forming region.

Figure 8D:
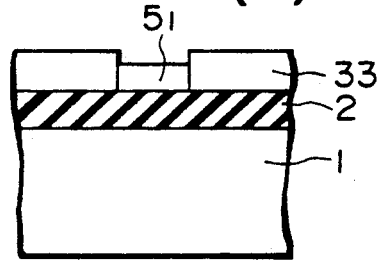

As shown in FIG. 8(d), the silicon oxide film 31 and silicon nitride film 32 are then etched away to expose the first polycrystalline silicon film 5 with the silicon oxide film 33 being left on the sidewall of the first polycrystalline silicon film 5.

Thereafter, similar to the first embodiment, impurities are injected into the first polycrystalline silicon film 5 to form a channel region 11 having a desired threshold value to thereby form the MOSFET. A window is formed in the trench alone in the trench section which is the capacitor region of the memory cell in resist mask process to eliminate the silicon oxide film 31, silicon nitride film 32 and silicon oxide film 33 in the trench to form the capacitor in the process in the first embodiment.

In this way, the production of the parasitic channel on the sidewall of the channel region 11 is prevented to thereby result in a DRAM which includes a MOSFET of high flatness and high reliability.

EMBODIMENT 3

A process for separating a channel using selective oxidization instead of the silicon oxide film 33 used for channel separation in the second embodiment will be described as a third embodiment of the present invention.

Similar to the second embodiment, only a cross-sectional view of the third embodiment corresponding to that of FIG. 1(c) is shown also here. The remaining structure of the third embodiment is similar to that of the first embodiment.

In the third embodiment, the sidewall of channel region 11 (11$_1$, 11$_2$ ...) is covered with an oxide film 43 formed by selective oxidization to prevent the formation of a parasitic channel on the sidewall of the channel.

Figure 10A:
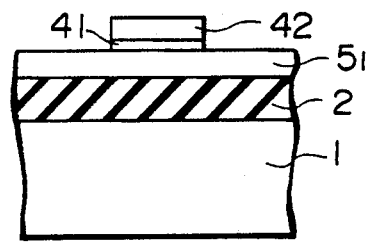
FIGS. 10(a)-10(c) illustrate the steps of manufacturing the DRAM in the embodiment of FIG. 9.
Figure 10B:
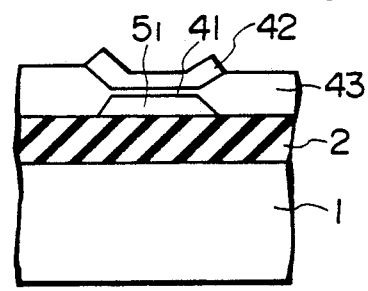
Figure 10C:
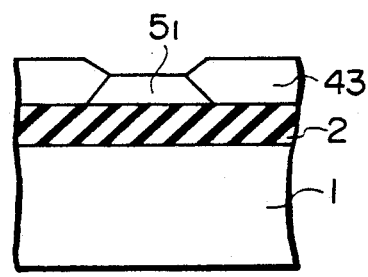

The process for manufacturing the DRAM will be described next. FIGS. 10(a)–10(c) are cross-sectional views of the DRAM, showing the process steps.

First similar to the first embodiment, a silicon oxide film 2 having a thickness of about 700 nm is formed on a surface of a silicon substrate 1, a trench 3 is formed, a first polycrystalline silicon film 5 is deposited by CVD so are to be about 100 nm thick on the overall surface of the substrate. Deposited sequentially on the film 5 are a silicon oxide film 41 having a thickness of about 50 nm and a silicon nitride film 42 having a thickness of about 150 nm. The films 41 and 42 are processed using a resist pattern (FIG. 10(a)). At this time, the pattern edges of the films 41 and 42 are formed so as to overhang from the trench (not shown) to the flat region such that the first polycrystalline silicon film 5 which will be the storage node electrode in the trench connects to the flat portion.

As shown in FIG. 10(b), the first polycrystalline silicon film 5 exposed from the patterns of the films 41 and 42 is oxidized by regular selective oxidization to form a silicon oxide film 43.

As shown in FIG. 10(c), the silicon oxide film 41 and silicon nitride film 42 are then etched away to expose the first polycrystalline silicon film 5 with the silicon oxide film 43 being left on the sidewall of the first polycrystalline silicon film 5.

Thereafter, similar to the first embodiment, impurities are injected into the first polycrystalline silicon film 5 to form a channel region 11 having a desired threshold value to thereby form the MOSFET. A window is formed in the trench alone in the trench section which is the capacitor region of the memory cell in resist mask process to eliminate the silicon oxide film 41 and silicon nitride film 42 in the trench to form the capacitor in the same process as in the first embodiment.

In this way, the production of a parasitic channel on the sidewall of the channel region 11 is prevented to thereby result in a DRAM which includes a MOSFET of high flatness and high reliability.

Since the DRAM having such structure is completely isolated from the substrate, no problems of leakage, etc., would arise even if peripheral circuits are formed close to the DRAM to thereby provide a higher degree of integration.

In manufacture, the process for manufacturing the DRAM is applicable to the formation of peripheral circuits with a reduced number of steps.

The formation of a CMS will be described as one example of a process for making peripheral circuits in the formation of a DRAM having the above structure. Herein, only the peripheral circuits will be described.

FIGS. 11(a)–11(e) corresponds to FIGS. 2–6 directed to the first embodiment.

First, an n-well 62 and a p-well 61 are formed which are regions to be a p-channel transistor and an n-channel transistor, respectively, on a surface of a p-type silicon substrate 1 having a resistivity of about 5 Ωcm. An insulator film 2 made of a silicon oxide film having a thickness of 700 nm is formed by selective oxidization. At this time, a silicon oxide film 2 is formed on the overall surface of the DRAM forming region. Inversion preventive n-type and p-type layers (not shown) should be formed beforehand below the silicon oxide films 2 of the n- and p-wells 62 and 61. Subsequently, the silicon substrate surface of the element forming region is exposed by etching, and a thermal oxide film 63 having a thickness of about 50 nm is formed on the exposed silicon substrate surface. This process may also include the process for forming the thermal oxide film 4 on the trench inner wall in the process for manufacturing the DRAM shown in FIG. 2. Thereafter, the first polycrystalline silicon film 5 is formed on the overall surface of the thermal oxide film 63 (FIG. 11(a)).

Figure 11A:
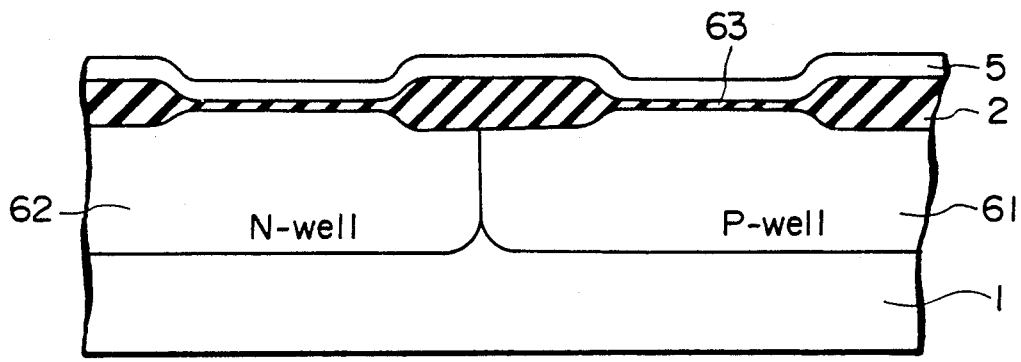
FIGS. 11(a)-11(e) illustrate the steps of manufacturing a peripheral circuit in comparison with the steps illustrated in the first embodiment.
Figure 11B:
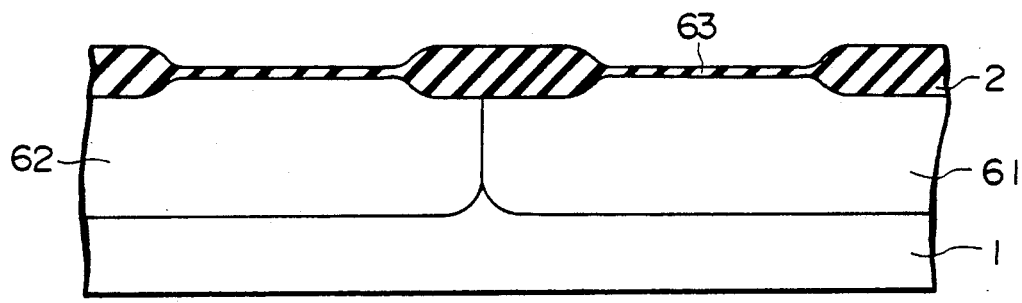

When the first polycrystalline silicon film 5 is patterned in the same process as shown in FIG. 3, the first polycrystalline silicon film 5 is etched away in the peripheral circuit forming section, as shown in FIG. 11(b).

Figure 11C:
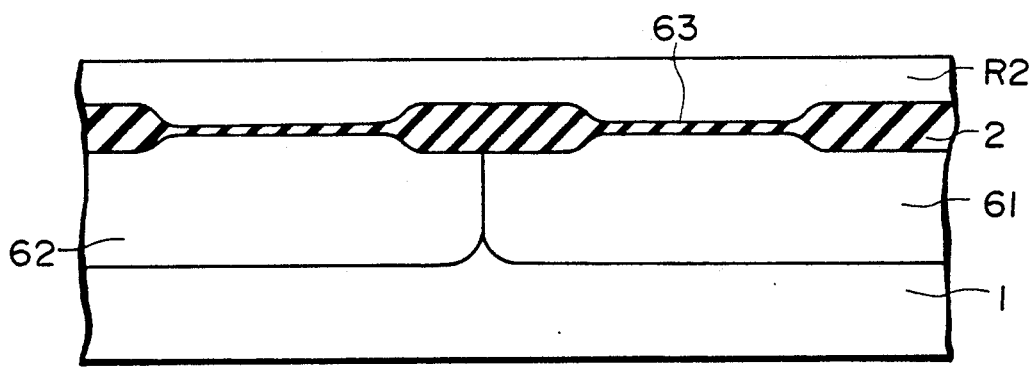

As shown in FIG. 11(c), the peripheral circuit section is covered with resist R2 and not doped even in the same doping process as shown in FIG. 4 for forming the storage node electrode in the trench.

Figure 11D:
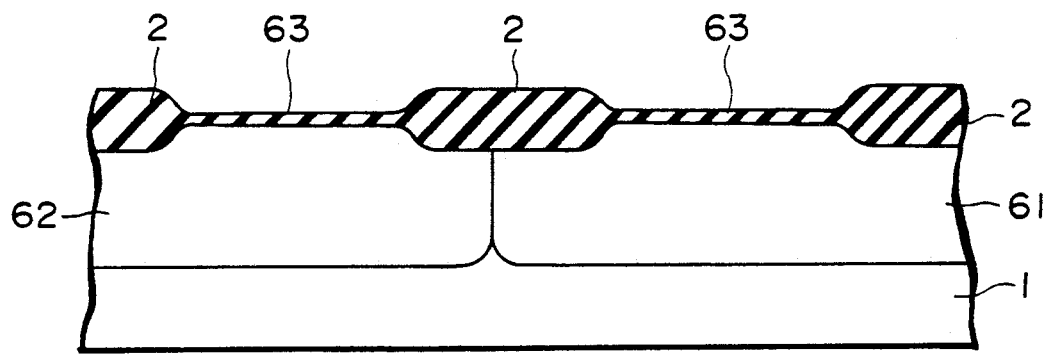
Figure 11E:
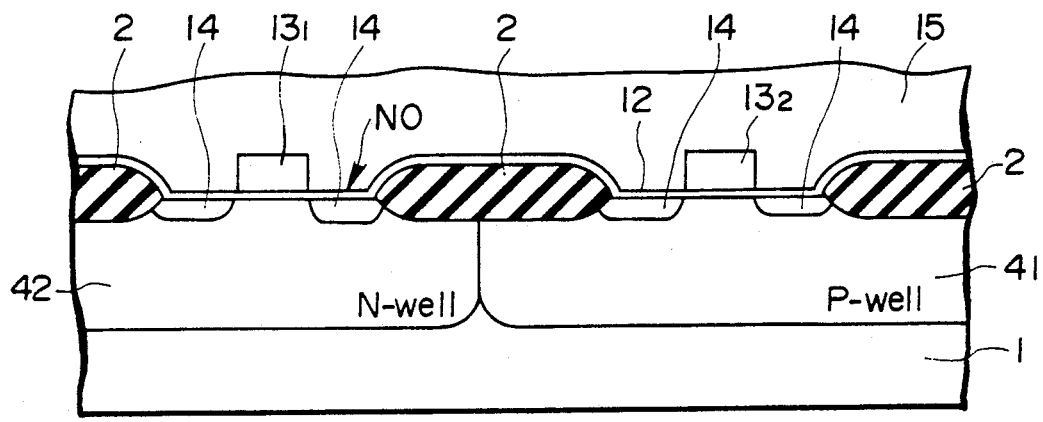

The peripheral circuit section is not influenced even in the same process as shown in FIG. 5 for forming the plate electrode 9 and the upper silicon oxide film (FIG. 11(d)).

Simultaneously with the formation of the gate electrode 13 shown in FIG. 6, the silicon oxide film 63 and the polycrystalline silicon film 5 in the element forming region are eliminated also in the peripheral circuit section to thereby expose the substrate surface. Thereafter, gate insulator film 12, gate electrode 13 and source and drain regions 14 are formed simultaneously with the formation of the MOSFET in the process for forming the DRAM. In the particular embodiment, since the transistor is of a CMOS type, channel ion implantation should be made beforehand in the p- and n-channel transistor forming regions after the formation of the gate insulator film and before the formation of the gate electrode. The gate electrode is then formed and impurities are diffused using the gate electrode as the mask to form the source and drain regions 14 (FIG. 11(e)).

Figure 11F:
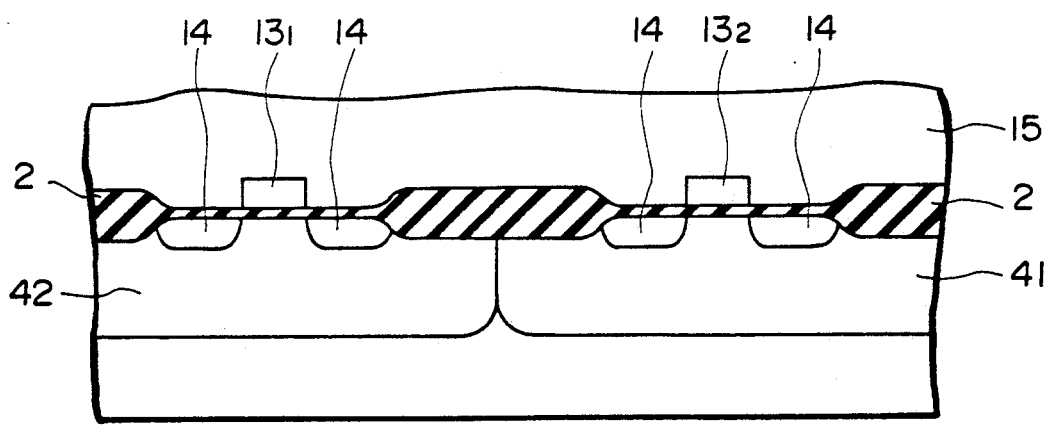
FIG. 11(f) shows a modification of the steps of FIG. 11(e)

While in the present embodiment a double film including a silicon nitride film and a silicon oxide film is illustrated as being used as the gate insulator film, a thermal oxide film 45 may be used only for the peripheral circuit section as shown in FIG. 11(f). In this case, a thermal oxide film 45 may be formed before the formation of the silicon oxide film, and then the deposited silicon nitride film may be removed only in the peripheral circuit forming region.

While in the present embodiment the peripheral circuit section is illustrated as being formed in the silicon substrate, the peripheral circuit section may be formed in the first polycrystalline silicon film 5 formed on the insulator film 2 as shown in FIG. 12, similar to the formation of the DRAM.

In this case, since the p- and n-MOSFETs are completely insulated from the substrate, no p- and n-wells are required to be formed.

In this structure, the gate insulator film 12 and the gate electrode 13 are formed on the surface of the channel region 11 formed by injecting desired impurities in the first polycrystalline silicon film 5 and the source and drain regions 14p and 14n are formed as in the previous embodiment. The numeral 51 denotes a lead layer for connection.

In manufacture, the first polycrystalline silicon film 5 is patterned in the MOSFET region. Simultaneously, the peripheral circuit forming region is also patterned. First, channel ions are implanted into the peripheral circuit forming region to set threshold voltages for p- and n-MOSFETs in the peripheral circuit forming region.

Similar to the formation of the memory cell section, the gate insulator film 12 and gate electrodes 13p and 13n are formed using the films 12 and electrodes 13p and 13n as the mask.

An inter-layer insulator film 15 is then formed on the source and drain regions, a contact hole and a lead layer 51 are formed to thereby complete the n- and p-MOSFETs in the peripheral circuit section.

While in the present embodiment MOSFETs having a regular structure are illustrated, they may have an LDD structure.

In this structure, the peripheral circuit section and memory cell section are formed with the same polycrystalline silicon film to thereby simplify the process. Since no wells are required to be formed in the peripheral circuit section, the area occupied by the MOSFET is reduced.

In the above embodiments the channels for MOSFETs are formed in the polycrystalline silicon film the quality of which influences the characteristics of the transistors, so that a high quality polycrystalline silicon film should be used.

To this end, after, for example, the polycrystalline silicon film is deposited, silicon ions may be implanted into that polycrystalline silicon film and annealed.

A process may be used which increases the size of grains in the polycrystalline silicon film by high temperature heat treatment step.

Further, it is very important to improve the quality of the polycrystalline silicon film using various methods.

The present invention is not limited to the use of a polycrystalline silicon layer and may use other semiconductor layers.

While in the above embodiments the positional relationship between adjacent ones of the memory cells disposed in rows in the direction of extension of the word lines is not shown, the arrangement of memory cells may have a folded bit line structure or an open bit line structure. For example if the arrangement of the memory cell has a folded bit line structure the gate electrodes of the adjacent ones of the memory cells disposed in rows in the direction of extension of the word lines pass over the plate electrode region.

It should be noted that various changes and modifications are possible within the scope of the present invention.

What is claimed is:

1. A semiconductor memory device comprising:
   a semiconductor substrate formed with a trench in a surface thereof, the surface of the substrate and an inner wall of the trench being covered with an insulator film;
   a capacitor including a storage node electrode of a first semiconductor layer having low resistance, a capacitor insulator film and a plate electrode, the storage node electrode, the capacitor insulator film and the plate electrode being sequentially laminated on the inner wall of the trench via the insulator film; and
   a MOSFET including a gate electrode and source and drain regions formed in a second semiconductor layer which is formed on the insulator film with a channel region formed in the second semiconductor layer between the source and drain regions, wherein one of the source and drain regions extends to a periphery of the trench so as to be connected to the storage node electrode,
   wherein said insulator film electrically isolates said capacitor and said MOSFET from said semiconductor substrate.

2. The semiconductor memory device according to claim 1, wherein the channel region has a sidewall surrounded by the insulator film.

3. The semiconductor memory device according to claim 1 or 2, wherein the plate electrode of the capacitor is formed within the trench region so that it does not overlap a region which defines said MOSFET.

4. A semiconductor memory device comprising:
   a semiconductor substrate formed with a trench in a surface thereof, the surface of the substrate and an inner wall of the trench being covered with an insulator film;

a first semiconductor layer formed on the insulator film in a region ranging from the inner wall of the trench to the surface of the substrate;

a capacitor including a storage node electrode having low resistance formed in the first semiconductor layer in a region corresponding to the inner wall of the trench, a capacitor insulator film and a plate electrode sequentially formed on the storage node electrode; and a MOSFET including a gate electrode and source and drain regions formed in the first semiconductor layer with a channel region formed in the first semiconductor layer between the source and drain regions, one of the source and drain regions being electrically connected to the storage node electrode, wherein said insulator film electrically isolates said capacitor and said MOSFET from said semiconductor substrate.

5. The semiconductor memory device according to claim 4, wherein the plate electrode of the capacitor is formed within the trench region so that it does not overlap a region which defines said MOSFET.

* * * * *